(12) United States Patent
Kuratani

(10) Patent No.: US 10,903,607 B2
(45) Date of Patent: Jan. 26, 2021

(54) ELECTRONIC UNIT

(71) Applicant: YAZAKI CORPORATION, Tokyo (JP)

(72) Inventor: Tatsuya Kuratani, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/559,484

(22) Filed: Sep. 3, 2019

(65) Prior Publication Data

US 2020/0076136 A1 Mar. 5, 2020

(30) Foreign Application Priority Data

Sep. 4, 2018 (JP) .................................. 2018-165415
Jul. 4, 2019 (JP) .................................. 2019-125450

(51) Int. Cl.
| | | |
|---|---|---|
| *H01R 13/66* | (2006.01) | |
| *H05K 5/00* | (2006.01) | |
| *H05K 7/06* | (2006.01) | |
| *H01R 24/64* | (2011.01) | |
| *H01R 13/502* | (2006.01) | |
| *H01R 13/516* | (2006.01) | |
| *H01R 13/6582* | (2011.01) | |

(52) U.S. Cl.
CPC ....... *H01R 13/6658* (2013.01); *H01R 13/502* (2013.01); *H01R 13/516* (2013.01); *H01R 13/6582* (2013.01); *H01R 24/64* (2013.01); *H05K 5/0026* (2013.01); *H05K 7/06* (2013.01)

(58) Field of Classification Search
CPC ......... H01R 24/64; H01K 5/0026; H05K 7/06
See application file for complete search history.

(56) References Cited

U.S. PATENT DOCUMENTS

| | | | | |
|---|---|---|---|---|
| 6,328,595 | B1 * | 12/2001 | Chang ................ | H01R 13/6641 439/490 |
| 7,422,471 | B1 * | 9/2008 | Wu .................... | H01R 13/6658 439/485 |
| 8,496,500 | B1 * | 7/2013 | Wu .................... | H01R 13/6461 439/638 |
| 9,325,092 | B2 * | 4/2016 | Makino ............... | H01R 12/724 |

(Continued)

FOREIGN PATENT DOCUMENTS

| | | | | |
|---|---|---|---|---|
| EP | 2445325 A2 | * | 4/2012 | .......... H05K 5/0069 |
| JP | 2011070853 A | * | 4/2011 | |
| JP | 2014-217254 A | | 11/2014 | |

*Primary Examiner* — Abdulah A Riyami
*Assistant Examiner* — Nader J Alhawamdeh
(74) *Attorney, Agent, or Firm* — Kenealy Vaidya LLP

(57) ABSTRACT

An electronic unit is provided. The electronic unit includes a circuit board provided with an electronic component and a terminal, a terminal holder fixed to the circuit board and holding the terminal, a first casing assembled so as to abut on the terminal holder, and a second casing assembled to the first casing so as to sandwich the terminal holder between the first casing and the second casing, and configured to maintain a state where the terminal holder and the first casing abut on each other by being engaged with the first casing so as to restrict movement of the first casing away from the terminal holder and by elastically pressing the terminal holder against the first casing through a pressing piece extending from the second casing.

12 Claims, 8 Drawing Sheets

(56) References Cited

U.S. PATENT DOCUMENTS

| | | | | |
|---|---|---|---|---|
| 2012/0094524 A1* | 4/2012 | Lin | ........................ | H01R 13/15 |
| | | | | 439/404 |
| 2019/0348792 A1* | 11/2019 | Yamamoto | ............. | H01R 13/41 |
| 2020/0076136 A1* | 3/2020 | Kuratani | .............. | H01R 13/502 |

* cited by examiner

ELECTRONIC UNIT

CROSS-REFERENCE TO RELATED APPLICATIONS

This application is based on and claims priority under 35 USC 119 from Japanese Patent Applications No. 2018-165415 filed on Sep. 4, 2018 and No. 2019-125450 filed on Jul. 4, 2019, the contents of which are incorporated herein by reference.

TECHNICAL FIELD

The present disclosure relates to an electronic unit in which a circuit board provided with an electronic component is accommodated in a casing.

BACKGROUND ART

In the related art, an electronic unit including a circuit board provided with an electronic component, a terminal, a connector, and the like, and a case for accommodating the circuit board is proposed. For example, one of the electronic units of the related art is configured to assemble the connector and the case by inserting a protrusion of the connector provided on the circuit board into a recess of the case (see PTL 1).

CITATION LIST

Patent Literature

PTL 1: JP-A-2014-217254

In the electronic unit of the related art described above, a gap may be generated between the protrusion and the recess due to manufacturing dimensional tolerance (so-called manufacturing variation) or the like at an assembly point of the protrusion of the connector and the recess of the case. In a case where the electronic unit of the related art is mounted and used in an automobile or the like, when vibration during traveling of the automobile is transmitted to the electronic unit, rattling may occur between the connector and the case due to the gap. Although the electronic unit is designed on the premise that such rattling may occur, when the rattling becomes excessively large, excessive vibration or the like may also occur in parts (for example, a terminal holder and a circuit board) inside the electronic unit. It is desirable that vibration of each part constituting such an electronic unit be suppressed as much as possible from a viewpoint of maintaining a proper operation of the electronic component incorporated in the electronic unit.

SUMMARY OF INVENTION

The present disclosure has been made in view of the circumstances described above, and an object thereof is to provide an electronic unit capable of suppressing rattling of each part even when external force such as vibration is applied from the outside at the time of use.

In order to achieve the object described above, the electronic unit according to the present disclosure is characterized by the following [1] to [6].

[1]

An electronic unit including a circuit board provided with an electronic component and a terminal for input and output, a terminal holder fixed to the circuit board and holding the terminal, a first casing assembled so as to abut on the terminal holder, and a second casing assembled to the first casing so as to sandwich the terminal holder between the first casing and the second casing. The second casing is configured to maintain a state where the terminal holder and the first casing abut on each other by being engaged with the first casing so as to restrict movement of the first casing away from the terminal holder and by elastically pressing the terminal holder against the first casing through a pressing piece extending from the second casing.

[2]

In the electronic unit described in [1], the first casing abuts on the terminal holder while being pressed along a predetermined assembling direction, and the second casing is configured to be engaged with an engagement target place of the first casing by an engagement portion provided in the second casing, configured to press a pressing target place of the terminal holder by the pressing piece, and configured such that a distance between the engagement portion and the pressing piece in the assembling direction is narrower than a distance between the engagement target place and the pressing target place in the assembling direction.

[3]

In the electronic unit described in [2], the second casing has a plurality of wall surfaces defining a rectangular cylindrical space for accommodating the circuit board and the terminal holder separately from the outside between the first casing and the second casing, the engagement portion is provided on one wall surface of the second casing, and the pressing piece is provided to extend from the one wall surface.

[4]

In the electronic unit described in [3], the one wall surface has a first portion provided with the engagement portion, a second portion offset in a direction closer to the circuit board than the first portion, and a third portion connecting the first portion and the second portion, and the pressing piece is configured to extend in a cantilever form from the third portion.

[5]

In the electronic unit described in any one of [2] to [4], the first casing includes a storage portion which receives the pressing piece so as to surround the pressing piece and restricts the pressing piece from being displaced in a direction different from the assembling direction.

[6]

In the electronic unit described in any one of [2] to [5], the terminal holder has a recess which is recessed in a direction away from the pressing piece along the assembling direction and has the pressing target place inside the recess.

According to the electronic unit configured as described in the above structure [1], in a state where the electronic unit is assembled, the pressing piece extending from the second casing elastically presses the terminal holder abutting on the first casing. This elastic pressing can be realized by elastic deformation (such as bending) of the pressing piece. Thus, rattling between the first casing and the terminal holder is less likely to occur. According to the law of action and reaction, since the second casing for pressing the terminal holder is also elastically pressed from the terminal holder through the pressing piece, rattling between the second casing and the terminal holder is less likely to occur. As a result, in the circuit board to which the terminal holder is fixed, vibration due to rattling of each part is less likely to occur. Accordingly, the electronic unit having this configuration can suppress the rattling of each part even when an external force such as vibration is applied from the outside at the time of use, as compared with the electronic unit of the related art.

According to the electronic unit configured as described in the above structure [2], in the assembling direction, the distance between the engagement portion of the second casing and the pressing piece is narrower than the distance between the engagement target place of the first casing and the pressing target place of the terminal holder. Thus, when the first casing and the second casing are assembled, the pressing piece of the second casing is pressed against the pressing target place of the terminal holder to thereby allow the engagement portion of the second casing to be engaged with the engagement target place of the first casing while being curved or the like so that the length of the pressing piece in the assembling direction is shortened. With this configuration, the state where an elastic piece of the second casing elastically presses the pressing target place of the terminal holder can be realized.

According to the electronic unit configured as described in the above structure [3], the engagement portion and the pressing piece of the second casing are provided on the same wall surface of the second casing. With this configuration, a structure of the second casing can be simplified as compared with the case where the engagement portion and the pressing piece are provided on different wall surfaces, which can contribute to miniaturization of the electronic unit and the like.

According to the electronic unit configured as described in the above structure [4], the wall surface of the second casing has a stepped structure having the first portion provided with the engagement portion, the second portion offset in a direction closer to the circuit board than the first portion, and the third portion connecting the first portion and the second portion. The pressing piece extends in a cantilever form from the stepped portion (that is, the third portion). With this configuration, the pressing piece has a simple shape extending along the assembling direction, as compared with a case where the pressing piece having a cantilever form is extended and curved from the first portion and second portion of the wall surface and directed to the terminal holder. As a result, for example, unintended stress concentration and the like can be suppressed, and durability of the pressing piece can be improved. In other words, a larger elastic force can be exerted from the pressing piece to the pressing target place of the terminal holder. Thus, the electronic unit having this configuration can further appropriately suppress the rattling of each part even when external force such as vibration is applied from the outside at the time of use.

According to the electronic unit configured as described in the above structure [5], the pressing piece of the second casing is surrounded by the storage portion of the first casing, and is restricted from being displaced in a direction different from the assembling direction. With this configuration, the state where the pressing piece appropriately presses the pressing target place of the terminal holder can be more reliably maintained. As a result, the electronic unit of this configuration can further appropriately suppress the rattling of each part even when external force such as vibration is applied from the outside at the time of use.

According to the electronic unit configured as described in the above structure [6], the pressing target place is provided inside the recess of the terminal holder, and the pressing piece extending from the second casing presses the pressing target place. Thus, for example, as compared with the case where the pressing target place is provided at a point other than the recess of the terminal holder, the pressing piece can be made longer by the amount the recess is recessed. As a result, for example, an amount of deformation of the pressing piece during assembly can be increased. In other words, assembly workability can be improved while avoiding enlargement of the electronic unit.

According to the present invention, it is possible to provide an electronic unit capable of suppressing rattling of each part even when external force such as vibration is applied from the outside at the time of use.

The present invention has been briefly described as above. Furthermore, details of the present disclosure will be further clarified by reading forms (hereinafter referred to as "embodiments") for carrying out the invention described below with reference to the accompanying drawings.

DESCRIPTION OF EMBODIMENTS

First Embodiment

Hereinafter, an electronic unit according to a first embodiment of the present disclosure will be described with reference to the drawings.

Figure 1:
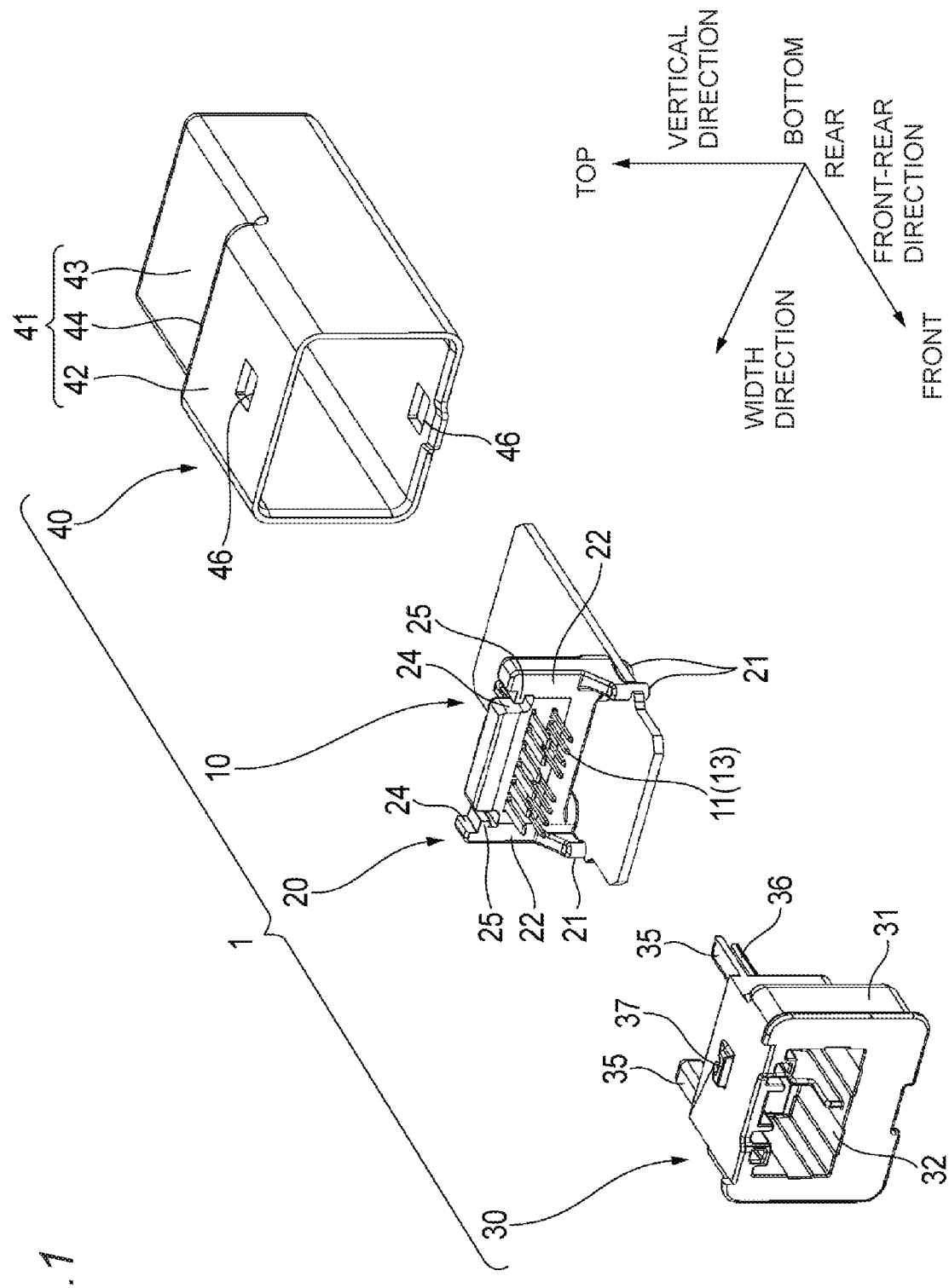
FIG. 1 is an exploded perspective view of an electronic unit according to a first embodiment.
Figure 2:
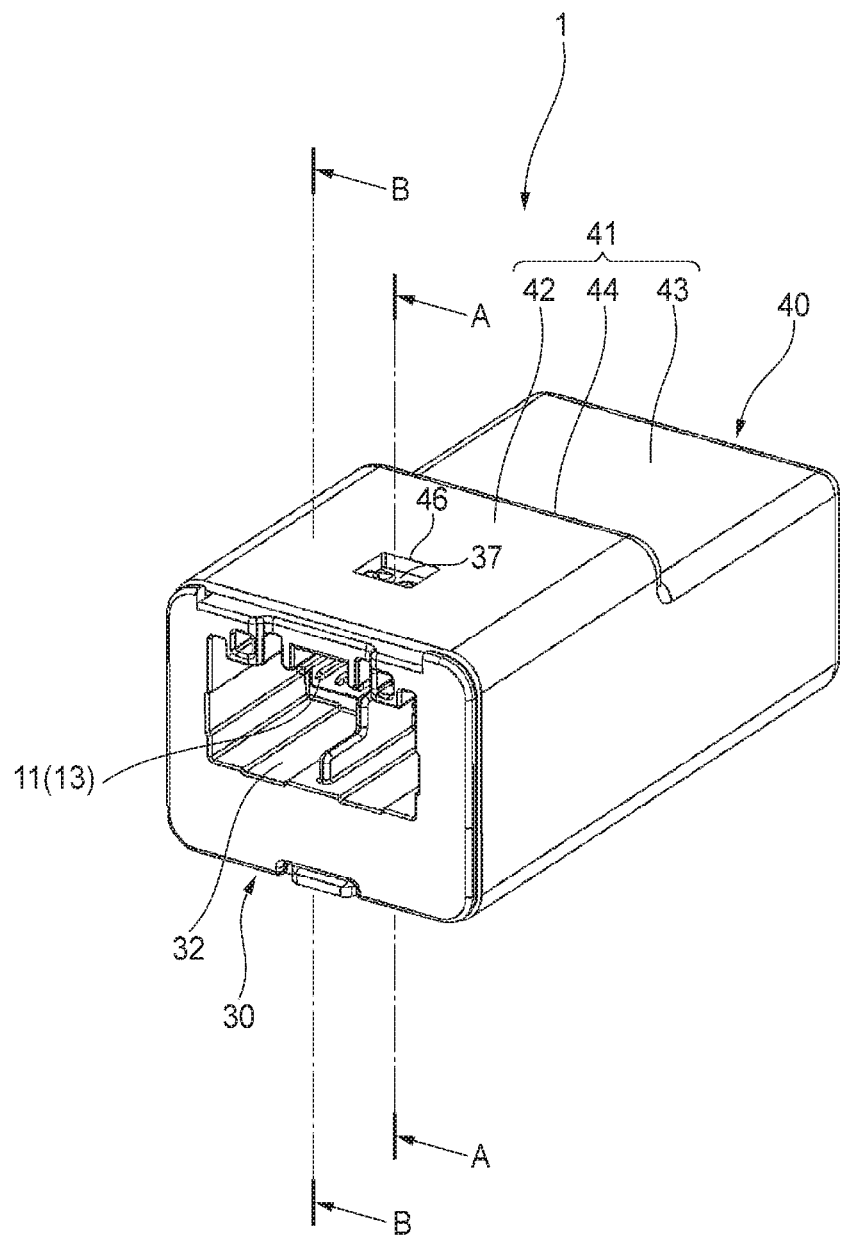
FIG. 2 is a perspective view of the electronic unit according to the first embodiment in which assembly is completed.

As illustrated in FIG. 1, an electronic unit 1 according to the first embodiment of the present disclosure includes a circuit board 10, a terminal holder 20 fixed to the circuit board 10, a connector cover 30 assembled to the terminal holder 20, and a main cover 40 assembled to the connector cover 30. In the electronic unit 1, the circuit board 10 and the terminal holder 20 are accommodated in a casing formed by the connector cover 30 and the main cover 40 assembled to each other.

Hereinafter, for convenience of explanation, as illustrated in FIG. 1, a front-and-rear direction, a vertical direction, a width direction, the front, the rear, the top, and the bottom are defined. The front-and-rear direction, the vertical direction, and the width direction are orthogonal to each other. The front-and-rear direction coincides with a fitting direction of the electronic unit 1 (more specifically, the connector cover 30) and a counterpart housing of a counterpart connector, the front surface side (the side closer to the counterpart connector) in the fitting direction corresponds to the front side, and the release side (the side away from the counterpart connector) in the fitting direction corresponds to the rear side. Hereinafter, members constituting the electronic unit 1 will be described in order.

Figure 3A:
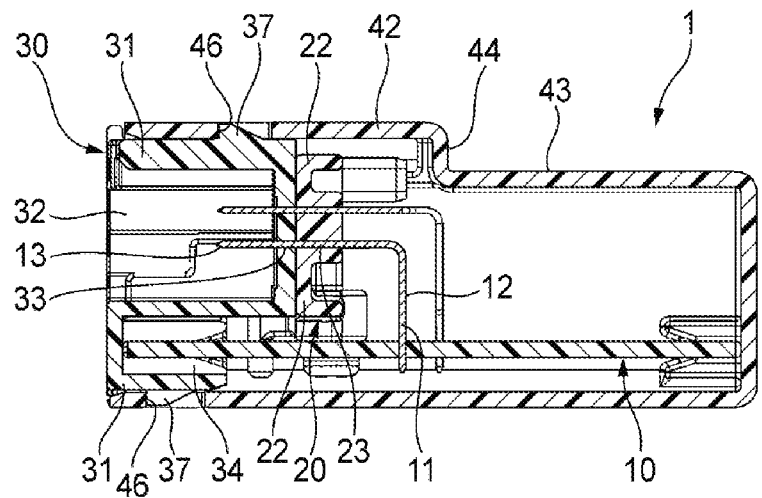
FIG. 3A is a cross-sectional view taken along line A-A of FIG. 2.

First, the circuit board 10 will be described. As illustrated in FIG. 1, the circuit board 10 made of resin is a rectangular flat plate-like board, and a plurality of electronic components (not illustrated) are provided on the top surface of the circuit board 10. As illustrated in FIG. 3A, the circuit board 10 is also provided with a plurality of L-shaped terminals 11. In this example, each L-shaped terminal 11 is composed of a rod-like base 12 extending in the vertical direction and a rod-like tip portion 13 extending forward from the upper end of the base 12, and the lower end portion of the base 12 is fixed to the circuit board 10 and electrically connected to a conductive pattern (not illustrated) formed on the circuit board 10.

Next, the terminal holder 20 will be described. As illustrated in FIG. 1, the terminal holder 20 made of resin is fastened and fixed to the top surface of the circuit board 10 using a bolt 26 (see FIG. 3B) by a fixing portion 21 integrally provided at a plurality of points (two points in the width direction in this example) of itself. The terminal holder 20 includes an upright wall portion 22 which rises upward from the top surface of the circuit board 10 and is continuous in the width direction.

A plurality of terminal holding holes 23 (see FIG. 3A) for holding a plurality of the terminals 11 are formed in the upright wall portion 22 so as to penetrate in the front-and-rear direction. By inserting the tip portions 13 of the plurality of terminals 11 into the corresponding terminal holding holes 23, the terminal holder 20 fixed to the circuit board 10 holds the plurality of terminals 11 in the direction in which the tip portions 13 extends forward.

In each of both end portions (that is, two points) in the width direction of the top surface of the upright wall portion 22, a recess 24 which is opened upward, is recessed downward, and penetrates in the front-and-rear direction and a protruding portion 25 which protrudes inward in the width direction from an inner wall outside the recess 24 in the width direction outside in the recess 24 are integrally provided (see FIG. 1). In the first embodiment, the front end surface of the protruding portion 25 is flush with the front end surface of the recess 24, and the rear end surface of the protruding portion 25 is flush with the rear end surface of the recess 24. Actions of the recess 24 and the protruding portion 25 will be described later.

Next, the connector cover 30 will be described. As illustrated in FIG. 1, the connector cover 30 made of resin includes a substantially rectangular peripheral wall portion 31 extending in the width direction when viewed from the front-and-rear direction, and has a substantially rectangular parallelepiped shape as a whole. At a predetermined position of the connector cover 30, a connector insertion hole 32 having a rectangular shape when viewed from the front, which is opened forward and closed at the rear, is formed. The connector insertion hole 32 is a hole for inserting the counterpart housing.

A plurality of terminal insertion holes 33 (see FIG. 3A) for inserting the plurality of terminals 11 are formed in the rear wall (bottom wall) of the connector insertion hole 32 so as to penetrate in the front-and-rear direction. In a state where assembling of the electronic unit 1 is completed, the tip portions 13 (male terminals) of the plurality of terminals 11 are positioned in the connector insertion hole 32 by respectively inserting the tip portions 13 of the plurality of terminals 11 into the corresponding terminal insertion holes 33. With this configuration, when the counterpart housing is inserted into the connector insertion hole 32, the terminal 11 (male terminal) and the counterpart terminal (female terminal) accommodated in the counterpart housing are connected and the counterpart connector and the electronic unit 1 are electrically connected.

Figure 3B:
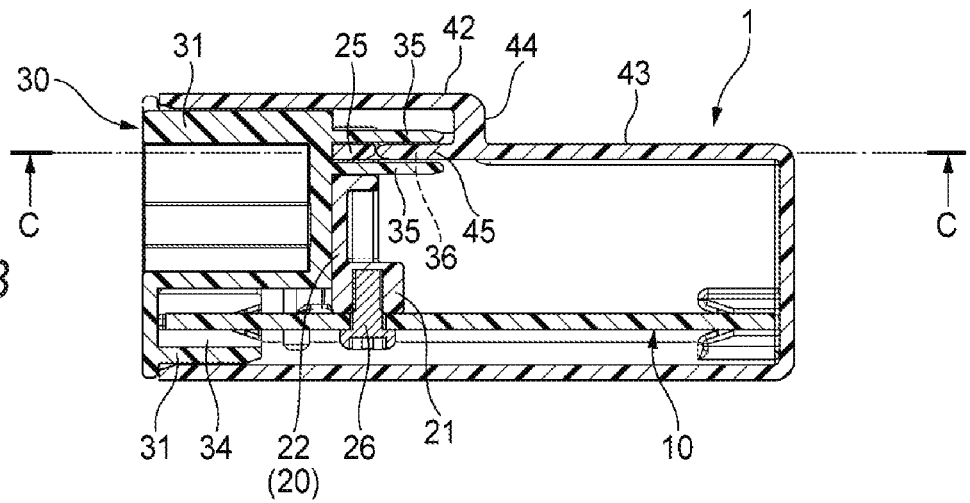
FIG. 3B is a cross-sectional view taken along line B-B of FIG. 2.

In the connector cover 30, at the lower position of the connector insertion hole 32, a board accommodation hole 34 having a rectangular shape when viewed from the rear, which is opened rearward and closed at the front, is formed (see FIGS. 3A and 3B). The board accommodation hole 34 is a hole for accommodating the front end portion of the circuit board 10 in the state where assembling of the electronic unit 1 is completed.

Figure 4A:
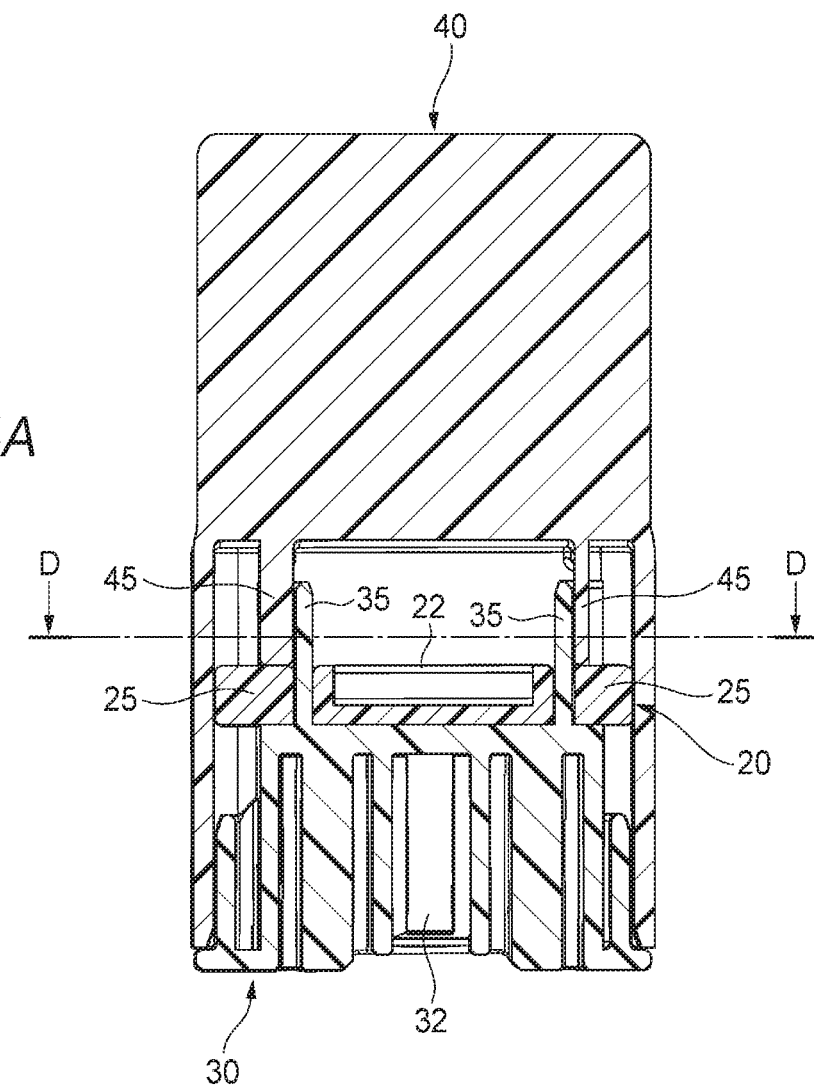
FIG. 4A is a cross-sectional view taken along line C-C of FIG. 3B.
Figure 4B:
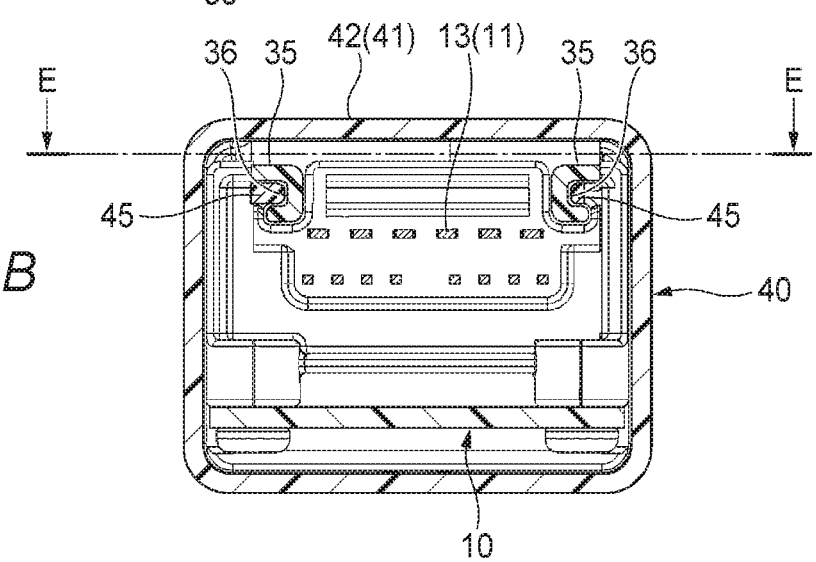
FIG. 4B is a cross-sectional view taken along line D-D of FIG. 4A.

In the upper portion of the rear wall of the connector cover 30, columnar storage portions 35 are integrally provided so as to protrude rearward at a plurality of points (two points) corresponding to the plurality (two) of protruding portions 25 of the terminal holder 20 (see FIG. 1, FIG. 3B, and FIG. 4A). In each storage portion 35, a groove 36 opened to the outside in the width direction, recessed inward in the width direction, and extending in the front-and-rear direction and opened forward is formed (see FIG. 4B). The groove 36 of the storage portion 35 is a portion that receives the protruding portion 25 of the terminal holder 20 and a pressing piece 45 (described later) so as to surround them in the state where assembling of the electronic unit 1 is completed.

In each of the central portions (that is, two points) in the width direction of the upper wall and the lower wall of the peripheral wall portion 31 of the connector cover 30, locking protrusions 37 that respectively protrude outward are integrally formed. The locking protrusions 37 respectively engage with locking holes 46 (described later) of the main cover 40 when the electronic unit 1 is assembled.

Next, the main cover 40 will be described. As illustrated in FIG. 1, the main cover 40 made of resin is a rectangular cylindrical box-like body which is opened forward and closed at the rear. The front opening of the main cover 40 has a shape corresponding to the peripheral wall portion 31 of the connector cover 30, and the main cover 40 and the connector cover 30 can be assembled (fitted) such that the front end portion defining the front opening in the main cover 40 overlaps the outside of the peripheral wall portion 31.

An upper wall 41 of the main cover 40 is configured by a flat plate-like first portion 42 occupying a front region of the upper wall 41, a flat plate-like second portion 43 which occupying a rear region of the upper wall 41 and offset downward with respect to the first portion 42, and a third portion 44 connecting the first and second portions 42 and 43 (see also FIGS. 3A and 3B).

As illustrated in FIGS. 3B and 4A, in the upper wall 41, the pressing pieces 45 respectively extending forward in a cantilever form from the lower surface (inner surface) of the third portion 44 are integrally provided at a plurality of points (two points) corresponding to the plurality of (two) protruding portions 25 of the terminal holder 20. Action of the pressing pieces 45 will be described later.

As illustrated FIG. 1, in the front end portion of the main cover 40, the locking holes (through-holes) 46 for locking the locking protrusions 37 are respectively provided at a plurality of (two) points in the circumferential direction corresponding to the plurality (two) of locking protrusions 37 of the connector cover 30.

Figure 3C:
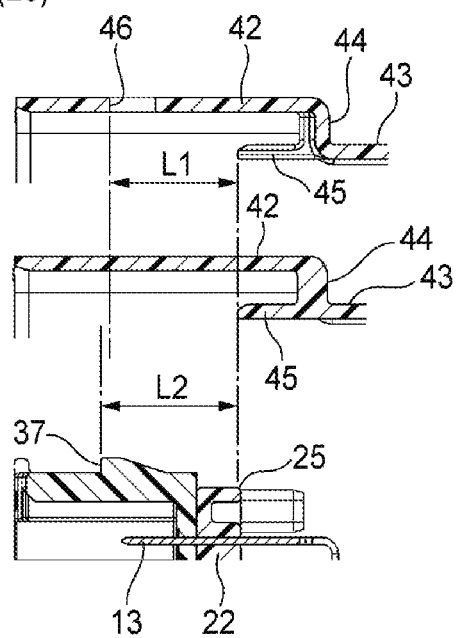
FIG. 3C is a view for explaining a dimensional relationship around a pressing piece.

As illustrated in FIG. 3C, in the state where assembling of the electronic unit 1 is completed, that is, the state where the protruding portion 25 of the terminal holder 20 and the pressing piece 45 of the main cover 40 are received by the storage portion 35 of the connector cover 30, and the terminal holder 20 and the connector cover 30 abut in the front-and-rear direction, a distance L1 between the locking hole 46 and the pressing piece 45 of the main cover 40 is slightly smaller than a distance L2 between the locking protrusion 37 of the connector cover 30 and the protruding portion 25 of the terminal holder 20 in the front-and-rear direction.

Thus, the members constituting the electronic unit 1 was described.

Figure 5:
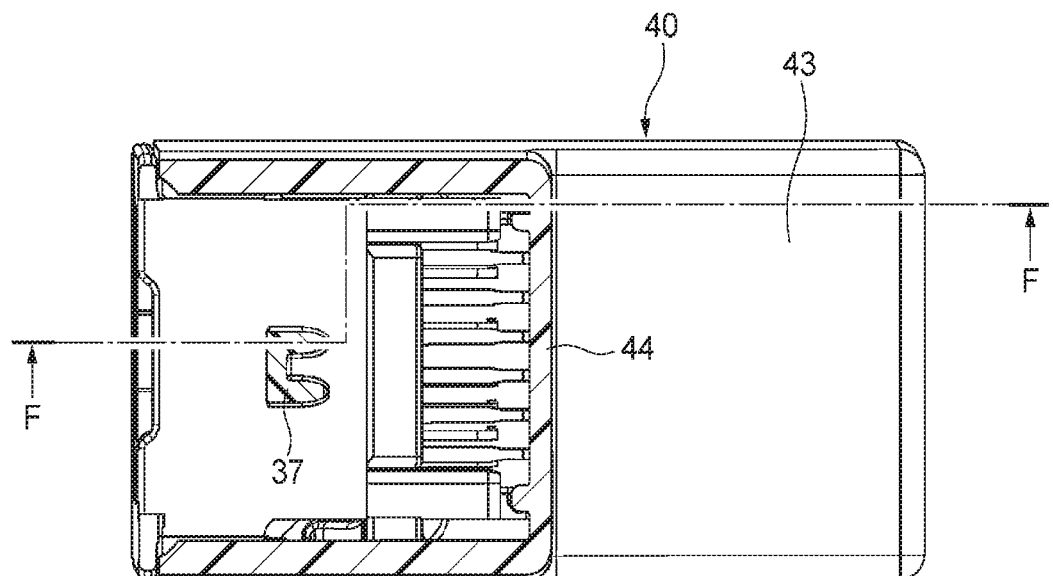
FIG. 5 is a cross-sectional view taken along line E-E of FIG. 4B.

Next, a procedure for assembling the electronic unit 1 by assembling the connector cover 30 and the main cover 40 will be described with reference to FIG. 6 which is a cross-sectional view taken along line F-F of FIG. 5.

Figure 6A:
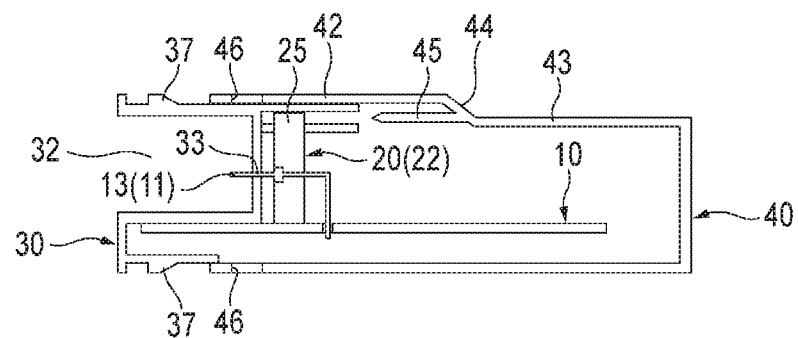
FIGS. 6A to 6E are cross-sectional views taken along line F-F of FIG. 5 and are views for explaining a procedure for assembling a connector cover and a main cover.

First, as illustrated in FIG. 6A, the connector cover 30 is assembled from the front side to the terminal holder 20 fixed to the circuit board 10. In this case, the protruding portions 25 of the terminal holder 20 are respectively received in the grooves 36 of the corresponding storage portions 35 of the connector cover 30 by allowing the front end portion of the circuit board 10 to be inserted into the board accommodation hole 34 of the connector cover 30, allowing the tip portion 13 of the terminal 11 held by the terminal holder 20 to be inserted into the terminal insertion hole 33 of the connector cover 30, and allowing the corresponding storage portions 35 of the connector cover 30 to be respectively inserted into the recesses 24 of the terminal holder 20. Even if the connector cover 30 abuts on the terminal holder 20 (the upright wall portion 22) in the front-and-rear direction, a gap may exist between the connector cover 30 and the terminal holder 20 as illustrated in FIG. 6A.

From this state, as illustrated in FIG. 6A, as the main cover 40 approaches the front from the rear side with respect to the fixed connector cover 30 so that the front end portion of the main cover 40 overlaps the outside of the peripheral wall portion 31 of the connector cover 30, fitting of the main cover 40 to the connector cover 30 is started. Thereafter, as the main cover 40 is pressed forward from the rear side and moves forward (approaches the fixed connector cover 30), the fitting progresses.

Figure 6B:
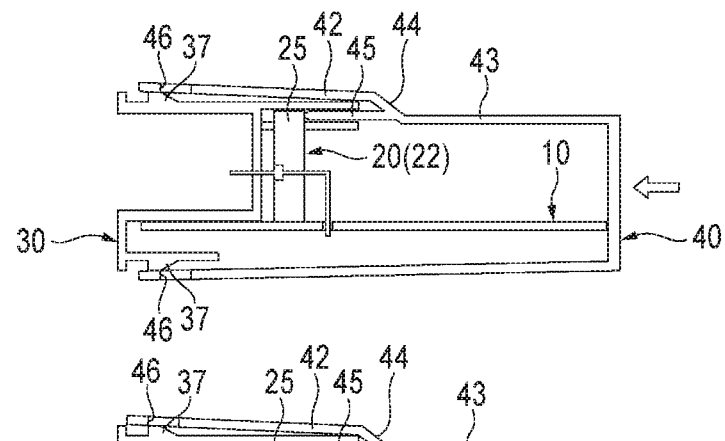

When the fitting progresses, as illustrated in FIG. 6B, the pressing pieces 45 of the main cover 40 respectively enter and are received in the grooves 36 of the corresponding storage portions 35 of the connector cover 30, and the pressing pieces 45 contact the protruding portions 25 of the terminal holder 20 already received in the grooves 36 of the storage portions 35.

At a stage where the pressing piece 45 contacts the protruding portion 25, although the front end portion of the main cover 40 is in a state of riding on the locking protrusion 37 of the connector cover 30, the locking hole 46 has not reached a lockable position with the locking protrusion 37. After the stage where the pressing piece 45 contacts the protruding portion 25, the terminal holder 20 approaches (moves forward) the connector cover 30 by pressing of the protruding portion 25 by the pressing piece 45, according to progress of the fitting.

Figure 6C:
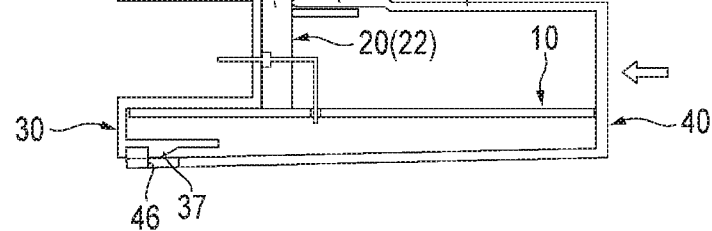

When the fitting further progresses, as illustrated in FIG. 6C, the terminal holder 20 abuts against the connector cover 30 in the front-and-rear direction. Also, at this stage, as described above, due to the relationship of "distance L1<distance L2" (see FIG. 3C), the locking hole 46 has not reached the lockable position with the locking protrusion 37.

Thus, the front end portion of the main cover 40 is maintained in a state of riding on the locking protrusion 37 of the connector cover 30.

Figure 6D:
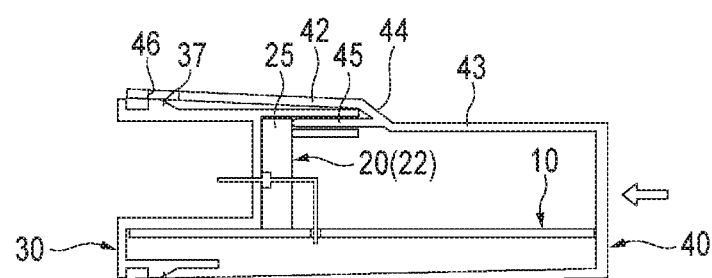

From this state, when the main cover 40 is further pressed forward from the rear side, as the pressing piece 45 elastically deforms (for example, curves), the length of the pressing piece 45 in the front-and-rear direction is shortened, and as an upper wall 41 of the main cover 40 (in particular, the second portion 43 near the third portion 44) is slightly curved upward, the fitting further proceeds. As a result, as illustrated in FIG. 6D, the locking hole 46 reaches the lockable position with the locking protrusion 37.

Figure 6E:
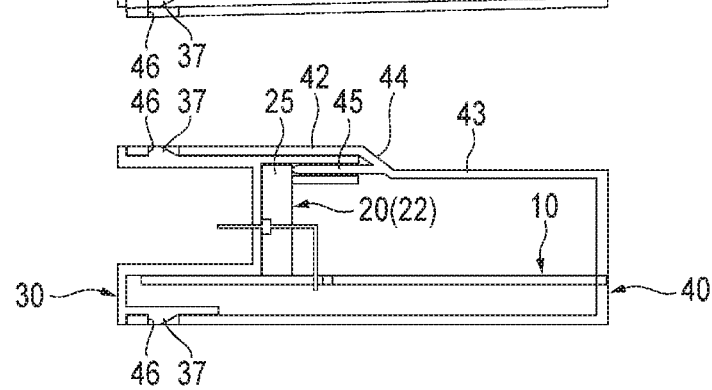

When the locking hole 46 reaches the lockable position with the locking protrusion 37, the locking protrusion 37 is locked in the locking hole 46 as illustrated in FIG. 6E. With this configuration, the state where the front end portion of the main cover 40 rides on the locking protrusion 37 is eliminated and assembling of the electronic unit 1 (assembling of the connector cover 30 and the main cover 40) is completed.

Second Embodiment

Figure 7A:
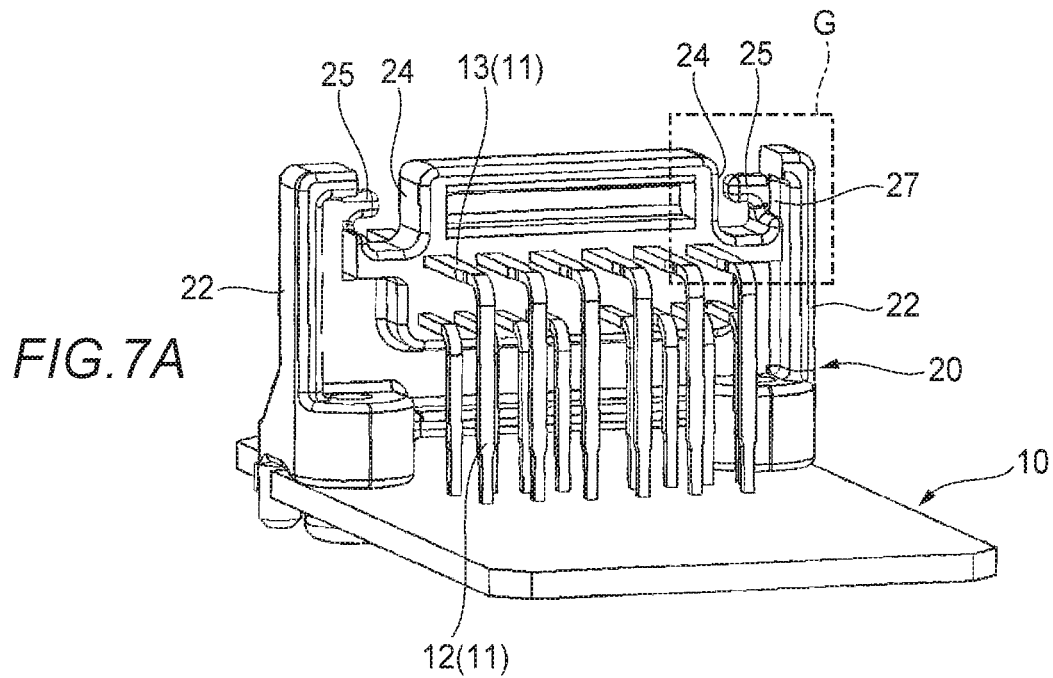
FIG. 7A is a perspective view of a terminal holder fixed to a circuit board in an electronic unit according to a second embodiment when viewed from the rear side.
Figure 7B:
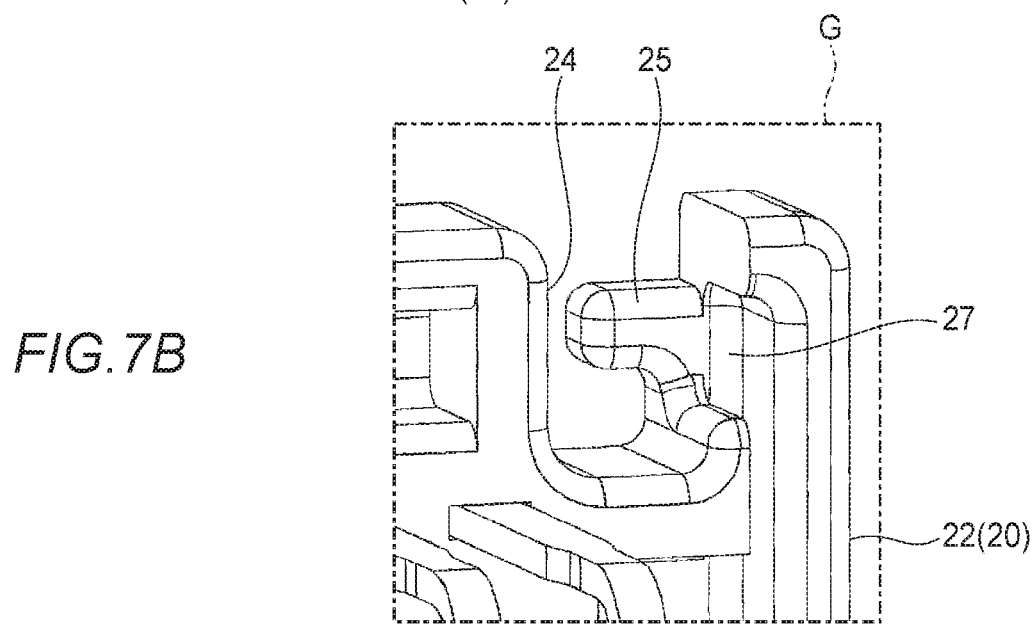
FIG. 7B is an enlarged view of G section of FIG. 7A.

Next, an electronic unit 2 according to a second embodiment of the present disclosure will be described with reference to FIGS. 7 and 8. The electronic unit 2 according to the second embodiment differs from the electronic unit 1 according to the first embodiment only in the shapes of the recess 24 and the protruding portion 25 of the terminal holder 20 and the pressing piece 45 of the main cover 40. Definitions for the front-and-rear direction, the vertical direction, the width direction, the front, the rear, the top, and the bottom in the electronic unit 2 according to the second embodiment are the same as the definitions (see FIG. 1) those in the first embodiment.

Specifically, in the first embodiment, as described above, the front end surface of the protruding portion 25 is flush with the front end surface of the recess 24, and the rear end surface of the protruding portion 25 is flush with the rear end surface of the recess 24 (see FIG. 1). In contrast, in the second embodiment, as illustrated in FIG. 7A and FIG. 7B, the recess 27 which is opened rearward and is recessed in the front is formed in the inner wall outside of the recess 24 in the width direction, and the protruding portion 25 protrudes inward of the recess 27 in the width direction from the bottom wall of the recess 27. As a result, the front end surface (the surface on the back side of the paper surface in FIG. 7) of the protruding portion 25 is flush with the front end surface of the recess 24 similarly as in the first embodiment, while the rear end surface (the surface on the front side of the paper surface in FIG. 7) of the protruding portion 25 is positioned forward (in the direction of the back of the paper surface in FIG. 7) of the rear end surface of the recess 24 by the amount that the recess 24 is recessed.

Figure 8A:
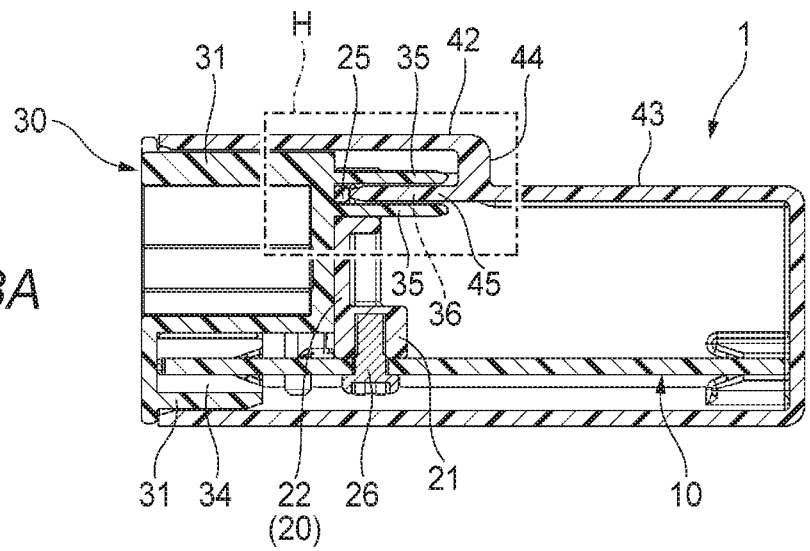
FIG. 8A is a view corresponding to FIG. 3B in the electronic unit according to the second embodiment.
Figure 8B:
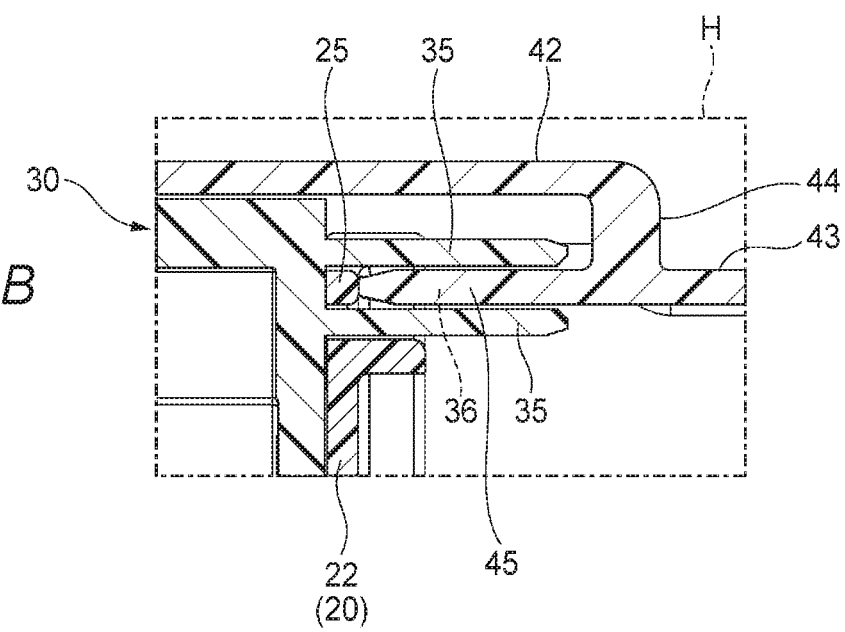
FIG. 8B is an enlarged view of H section of FIG. 8A.

As such, in the second embodiment, as compared with the first embodiment, due to the rear end surface of the protruding portion 25 being positioned forward of the rear end surface of the recess 24, an extension length of the pressing piece 45 extending forward is longer, as apparent from the comparison of FIGS. 3B and 8A. As a result, compared with the first embodiment, the amount of deformation of the pressing piece 45 at the time of assembly can be increased while maintaining the size of the electronic unit 2 the same as that of the electronic unit 1 and workability at the time of assembling the terminal holder 20, the connector cover 30, and the main cover 40 can be improved.

Thus, according to the electronic units 1 and 2 according to the respective embodiments of the present disclosure, in the state where assembling of the electronic units 1 and 2 are completely, the pressing piece 45 extending from the main cover 40 elastically presses (the protruding portion 25 of) the terminal holder 20 abutting on the connector cover 30. This elastic pressing is realized by allowing the pressing piece 45 to be elastically deformed (curved) and allowing the upper wall 41 of the main cover 40 (in particular, the second portion 43 near the third portion 44) to be curved slightly upward.

With this configuration, rattling between the connector cover 30 and the terminal holder 20 is less likely to occur. According to the law of action and reaction, since the main cover 40 for pressing the terminal holder 20 is also elastically pressed from the terminal holder 20 through the pressing piece 45, rattling between the main cover 40 and the terminal holder 20 is less likely to occur. As a result, in the circuit board 10 to which the terminal holder 20 is fixed, vibration due to rattling of each part is less likely to occur. Accordingly, the electronic units 1 and 2 can suppress the rattling of each part even when an external force such as vibration is applied from the outside at the time of use, as compared with the electronic unit of the related art.

Furthermore, according to the electronic units 1 and 2 according to the respective embodiments, in the front-and-rear direction (assembling direction), the distance L1 between the pressing piece 45 and the locking hole 46 of the main cover 40 is narrower than the distance L2 between the locking protrusion 37 of the connector cover 30 and the protruding portion 25 of the terminal holder 20 (see FIG. 3C). In this case, when the connector cover 30 and the main cover 40 are assembled, the pressing piece 45 of the main cover 40 is pressed against the protruding portion 25 of the terminal holder 20 to thereby allow the locking hole 46 of the main cover 40 to be engaged with the locking protrusion 37 of the connector cover 30 while being curved or the like so that the length of the pressing piece 45 in the front-and-rear direction is shortened. With this configuration, the state where the pressing piece 45 of the main cover 40 elastically presses the protruding portion 25 of the terminal holder 20 can be realized.

Furthermore, according to the electronic units 1 and 2 according to the respective embodiments, the locking hole 46 and the pressing piece 45 of the main cover 40 are provided on the same upper wall 41 of the main cover 40. With this configuration, a structure of the main cover 40 can be simplified as compared with the case where the locking holes 46 and the pressing pieces 45 are provided on different wall surfaces, which can contribute to miniaturization of the electronic units 1 and 2 and the like.

Furthermore, according to the electronic units 1 and 2 according to the respective embodiments, the upper wall 41 of the main cover 40 has a stepped structure having the first portion 42 provided with the locking hole 46, the second portion 43 offset in a direction (downward) closer to the circuit board 10 than the first portion 42, and the third portion 44 connecting the first portion 42 and the second portion 43. The pressing piece 45 extends in a cantilever form from the stepped portion (that is, the third portion 44). With this configuration, the pressing piece 45 has a simple shape extending along the front-and-rear direction (assembling direction), as compared with the case where the pressing piece 45 having a cantilever form is extended and curved from the first portion 42 and the second portion 43 of the upper wall 41 and directed to the terminal holder. As a result, for example, unintended stress concentration and the like can be suppressed, and durability of the pressing piece 45 can be improved. In other words, a larger elastic force can be exerted from the pressing piece 45 to the protruding portion 25 (pressing target place) of the terminal holder 20. Thus, the electronic units 1 and 2 can further appropriately suppress the rattling of each part even when external force such as vibration is applied from the outside at the time of use.

Furthermore, according to the electronic units 1 and 2 according to the respective embodiments, the pressing piece 45 of the main cover 40 is surrounded by the groove 36 of the storage portion 35 of the connector cover 30 and is restricted from being displaced in a direction different from the front-and-rear direction (assembling direction). With this configuration, the state where the pressing piece 45 appropriately presses the protruding portion 25 of the terminal holder 20 can be more reliably maintained. As a result, the electronic units 1 and 2 can further appropriately suppress the rattling of each part even when external force such as vibration is applied from the outside at the time of use.

Furthermore, according to the electronic unit 2 of the second embodiment, the protruding portion 25 is provided inside the recess 27 (see FIG. 7) of the terminal holder 20, and the pressing piece 45 extending from the main cover 40 presses the protruding portion 25. Thus, as compared with the electronic unit 1 according to the first embodiment, the pressing piece 45 is longer by the amount the recess 27 is recessed. As a result, for example, the amount of deformation of the pressing piece 45 during assembly can be increased. In other words, while the size of the electronic unit 2 is the same as that of the electronic unit 1, workability at the time of assembling the terminal holder 20, the connector cover 30, and the main cover 40 can be improved.

Furthermore, according to the electronic units 1 and 2 according to the respective embodiments, it has been found by the inventor's tests and studies that the maximum stress occurs in the second portion 43 near the step portion (third portion 44) provided on the upper wall 41 of the main cover 40 in a state where the connector cover 30 and the main cover 40 are assembled (the state where the locking protrusion 37 is locked in the locking hole 46). With this configuration, when the main cover 40 is assembled to a relay box or the like, it is possible to avoid that the outermost shape of the main cover 40 changes and the main cover 40 becomes difficult to assemble.

<Other Form>

The present disclosure is not limited to the embodiments described above, and various modifications can be adopted within the scope of the present disclosure. For example, the present disclosure is not limited to the embodiments described above, and appropriate modifications, improvements, and the like may be made thereto. In addition, the material, shape, dimension, number, arrangement point, and the like of each constitutional element in the embodiments described above are optional and not limited as long as the present disclosure can be achieved.

In each of the embodiments described above, the pressing piece 45 is provided on the stepped portion (third portion 44) of the upper wall 41. In contrast, the pressing piece 45 may be provided on the first portion 42 and the second portion 43 of the upper wall 41.

Furthermore, in each of the embodiments described above, the locking hole 46 and the pressing piece 45 of the main cover 40 are provided on the same upper wall 41 of the main cover 40. In contrast, the locking hole 46 and the pressing piece 45 of the main cover 40 may be provided on different wall surfaces of the main cover 40.

Here, features of the embodiment of each of the electronic units 1 and 2 according to the present disclosure described above will be briefly summarized and listed in the following [1] to [6].

[1]

The electronic unit 1 including the circuit board 10 provided with an electronic component and the terminal 11 for input and output, the terminal holder 20 fixed to the circuit board 10 and holding the terminal 11, the first casing 30 assembled so as to abut on the terminal holder 20, and the second casing 40 assembled to the first casing 30 so as to sandwich the terminal holder 20 between the first casing 30 and the second casing 40, the second casing being configured to maintain a state where the terminal holder 20 and the first casing 30 abut on each other by being engaged with the first casing 30 so as to restrict movement of the first casing 30 away from the terminal holder 20 and by elastically pressing the terminal holder 20 against the first casing 30 through the pressing piece 45 extending from the second casing 40.

[2]

In the electronic unit 1 described in [1], the first casing 30 abuts on the terminal holder 20 while being pressed along a predetermined assembling direction, and the second casing 40 is configured to be engaged with the engagement target place 37 of the first casing 30 by the engagement portion 46 provided in the second casing 40, configured to press the pressing target place 25 of the terminal holder 20 by the pressing piece 45, and configured such that a distance between the engagement portion, and the distance L1 between the engagement portion 46 and the pressing piece 45 in the assembling direction is narrower than the distance L2 between the engagement target place 37 and the pressing target place 25 in the assembling direction.

[3]

In the electronic unit 1 described in [2], the second casing 40 has a plurality of wall surfaces defining a rectangular cylindrical space for accommodating the circuit board 10 and the terminal holder 20 separately from the outside between the first casing 30 and the second casing, the engagement portion 46 is provided on one wall surface 41 of the second casing 40, and the pressing piece 45 is provided to extend from the one wall surface 41.

[4]

In the electronic unit 1 described in [3], the one wall surface 41 has the first portion 42 provided with the engagement portion 46, the second portion 43 offset in a direction closer to the circuit board 10 than the first portion 42, and the third portion 44 connecting the first portion 42 and the second portion 43, and the pressing piece 45 is configured to extend in a cantilever form from the third portion 44.

[5]

In the electronic unit 1 described in any one of [2] to [4], the first casing 30 includes the storage portion 35 which receives the pressing piece 45 so as to surround the pressing piece 45 and restricts the pressing piece 45 from being displaced in a direction different from the assembling direction.

[6]

In the electronic unit described in any one of [2] to [5], the terminal holder 20 has the recess 27 which is recessed in a direction away from the pressing piece 45 along the assembling direction and has the pressing target place 25 inside the recess 27.

What is claimed is:

1. An electronic unit comprising:
a circuit board provided with an electronic component and a terminal for input and output;
a terminal holder fixed to the circuit board and holding the terminal;
a first casing assembled to the terminal holder so as to abut on the terminal holder; and
a second casing assembled to the first casing so as to sandwich the terminal holder between the first casing and the second casing, the second casing being configured to maintain a state where the terminal holder and the first casing abut on each other by being engaged with the first casing so as to restrict movement of the first casing away from the terminal holder and by elastically pressing the terminal holder against the first casing through a pressing piece extending from the second casing.

2. The electronic unit according to claim 1,
wherein the first casing abuts on the terminal holder while being pressed along a predetermined assembling direction, and
the second casing is configured to be engaged with an engagement target place of the first casing by an engagement portion provided in the second casing and configured to press a pressing target place of the terminal holder by the pressing piece, and configured such that a distance between the engagement portion and the pressing piece in the assembling direction is narrower than a distance between the engagement target place and the pressing target place in the assembling direction.

3. The electronic unit according to claim 2,
wherein the second casing has a plurality of wall surfaces defining a rectangular cylindrical space for accommodating the circuit board and the terminal holder separately from the outside between the first casing and the second casing,
the engagement portion is provided on one wall surface of the second casing, and
the pressing piece is provided to extend from the one wall surface.

4. The electronic unit according to claim 3,
wherein the one wall surface has a first portion provided with the engagement portion, a second portion offset in a direction closer to the circuit board than the first portion, and a third portion connecting the first portion and the second portion, and
the pressing piece is configured to extend in a cantilever form from the third portion.

5. The electronic unit according to claim 2,
wherein the first casing includes a storage portion which receives the pressing piece so as to surround the pressing piece and restricts the pressing piece from being displaced in a direction different from the assembling direction.

6. The electronic unit according to claim 2,
wherein the terminal holder has a recess which is recessed in a direction away from the pressing piece along the assembling direction and has the pressing target place inside the recess.

7. The electronic unit according to claim 1,
wherein the first casing is detachable from the terminal holding.

8. The electronic unit according to claim 1,
wherein the first casing, the second casing, and the terminal holding are all detachable from each other.

9. The electronic unit according to claim 1,
wherein the terminal holder and the first casing abut on each other in a predetermined assembling direction.

10. The electronic unit according to claim 2,
wherein the second casing is configured to press the pressing target place of the terminal holder by the pressing piece in the assembling direction.

11. The electronic unit according to claim 1,
wherein the circuit board and the terminal holder are accommodated in a casing formed by the first casing and the second casing assembled to each other.

12. The electronic unit according to claim 2,
wherein the pressing target place of the terminal holder is received by a storage portion of the first casing.

* * * * *